United States Patent
Lin (10) Patent No.: US 12,096,589 B2
(45) Date of Patent: Sep. 17, 2024

(54) CASING ASSEMBLY AND ELECTRONIC DEVICE INCLUDING THE SAME

(71) Applicant: WISTRON CORP., New Taipei (TW)

(72) Inventor: Yao Lin Lin, New Taipei (TW)

(73) Assignee: WISTRON CORP., New Taipei (TW)

( * ) Notice: Subject to any disclaimer, the term of this patent is extended or adjusted under 35 U.S.C. 154(b) by 238 days.

(21) Appl. No.: 17/812,237

(22) Filed: Jul. 13, 2022

(65) Prior Publication Data

US 2023/0309256 A1  Sep. 28, 2023

(30) Foreign Application Priority Data

Mar. 23, 2022  (TW) .................................. 111110822

(51) Int. Cl.
*H05K 7/14* (2006.01)

(52) U.S. Cl.
CPC ......... *H05K 7/1489* (2013.01); *H05K 7/1401* (2013.01); *H05K 7/1411* (2013.01); *H05K 7/1487* (2013.01)

(58) Field of Classification Search
CPC .. H05K 7/1401; H05K 7/1405; H05K 7/1409; H05K 7/1411; H05K 7/1487; H05K 7/1488; H05K 7/1489; H05K 5/0221; H05K 5/023; G06F 1/183; G06F 1/184; G06F 1/185; G06F 1/187; G06F 1/1679; A47B 88/423; A47B 2088/4235; A47B 88/427; A47B 2088/4276; A47B 88/43; A47B 88/49; A47B 88/483; A47B 88/497; E05B 65/46; G11B 33/128

See application file for complete search history.

(56) References Cited

U.S. PATENT DOCUMENTS

| | | | | |
|---|---|---|---|---|
| 5,286,214 A | * | 2/1994 | Takahashi | H01R 13/633 439/159 |
| 5,299,946 A | * | 4/1994 | Kusakabe | G06K 13/08 439/159 |
| 5,305,180 A | * | 4/1994 | Mitchell | G06F 1/1656 361/728 |
| 5,573,413 A | * | 11/1996 | David | G06K 13/08 439/157 |
| 5,655,917 A | * | 8/1997 | Kaneshige | H01R 13/6272 439/352 |
| 6,074,227 A | * | 6/2000 | Ho | H01R 13/635 439/152 |
| 6,095,835 A | * | 8/2000 | Oguchi | G06K 13/0806 439/159 |

(Continued)

OTHER PUBLICATIONS

TW Office Action dated Oct. 18, 2022 in Taiwan application No. 111110822.

*Primary Examiner* — Adrian S Wilson
*Assistant Examiner* — Gage Crum
(74) *Attorney, Agent, or Firm* — McClure, Qualey & Rodack, LLP (57) ABSTRACT

A casing assembly is adapted for a detachable module and includes a casing, a handle, and a trigger, where the casing is configured to accommodate the at least one detachable module, the handle is movably disposed on the casing, the trigger is rotatably disposed on the casing and connected to the handle, and the trigger comprises a triggering portion selectively moving the detachable module away from the casing.

20 Claims, 13 Drawing Sheets

(56) References Cited

U.S. PATENT DOCUMENTS

| | | | |
|---|---|---|---|
| 6,210,188 B1* | 4/2001 | Chang | G06K 13/0806 |
| | | | 439/159 |
| 6,406,312 B1* | 6/2002 | Heitkamp | H05K 7/1409 |
| | | | 439/157 |
| 6,587,350 B1* | 7/2003 | Lin | H05K 7/1411 |
| | | | 361/801 |
| 6,814,597 B1* | 11/2004 | Kao | H01R 13/633 |
| | | | 439/923 |
| 8,189,327 B2* | 5/2012 | Chang | H05K 5/0295 |
| | | | 361/679.01 |
| 10,827,641 B1* | 11/2020 | Shen | H05K 7/20709 |
| 2002/0044419 A1* | 4/2002 | Salinas | G06F 1/187 |
| | | | 361/726 |
| 2010/0033927 A1* | 2/2010 | Nakamura | G11B 33/124 |
| | | | 361/679.58 |
| 2011/0049317 A1* | 3/2011 | Peng | G06F 1/187 |
| | | | 248/231.9 |
| 2015/0131227 A1* | 5/2015 | Howell | G06F 1/185 |
| | | | 211/26 |
| 2023/0284406 A1* | 9/2023 | Yang | H05K 5/0221 |
| | | | 361/679.58 |

\* cited by examiner

CASING ASSEMBLY AND ELECTRONIC DEVICE INCLUDING THE SAME

CROSS-REFERENCE TO RELATED APPLICATIONS

This non-provisional application claims priority under 35 U.S.C. § 119(a) on Patent Application No(s). 111110822 filed in R.O.C. (Taiwan) on Mar. 23, 2022, the entire contents of which are hereby incorporated by reference.

TECHNICAL FIELD

The disclosure relates to a casing assembly, more particularly relates to a casing assembly and electronic device including the same.

BACKGROUND

With the advancement of cloud services and related technologies, the market demand for serves is increasing. For this reason, related business continue to increase the computing power of servers in a limited room space. In order to improve the servers as well as the management and maintenance, it is necessary to properly plan the internal space of server.

Taking a blade server as an example, conceptually, a blade server modularizes various devices and components, such as processor, motherboard, memory, and hard disks, and these devices and components share the same casing. In this way, a plurality of physical servers can operate independently or form a cluster server, and the servers in the same casing can be centrally managed, simplifying cabling arrangement and sharing the same power source and cooling system. Thus, the blade server is known as one of the solutions that can configure the servers at a high density in a certain space while achieving convenience of server management.

However, in the cases that the blade servers are larger in size, the weight of the server on it is heavier, and the force that backplane holds the connector of the servers, it will be more laborious to remove the servers. Understandably, other systems with submodules may encounter similar problems.

SUMMARY

Accordingly, one aspect of the disclosure is to provide a casing assembly and electronic device including the same which facilitate the installation and removal of the accommodated module.

One embodiment of the disclosure provides a casing assembly adapted for at least one detachable module and including a casing, a handle, and a trigger, where the casing is configured to accommodate the at least one detachable module, the handle is movably disposed on the casing, the trigger is rotatably disposed on the casing and connected to the handle, and the trigger comprises a triggering portion selectively moving the detachable module away from the casing.

One embodiment of the disclosure provides an electronic device adapted for at least one detachable module and including a casing, a handle, and a trigger, where the casing is configured to accommodate the at least one detachable module, the handle is movably disposed on the casing, the trigger is rotatably disposed on the casing and connected to the handle. When the handle is moved along a pushing direction, the trigger moves the detachable module along a removal direction opposite to the pushing direction by being forced by the handle.

According to the casing assembly and electronic device including the same as discussed in the above embodiments of the disclosure, the trigger is connected to the handle and able to move the detachable module, thus pushing the handle in a pushing direction can cause the trigger to move the detachable module in an opposite direction. This arrangement enables a toolless and easy removal of the detachable module simply by one push and thus helping to provide an effortlessly and efficient way to install and remove modules that are heavy or large in size.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein:

FIGS. 8A, 8B-9 depict the operation of the casing assembly according to one embodiment of the disclosure;

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. Unless specified or limited otherwise, the terms "mounted,"

"connected," and variations thereof are used broadly and encompass both direct and indirect mountings and connections. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities.

Figure 1:
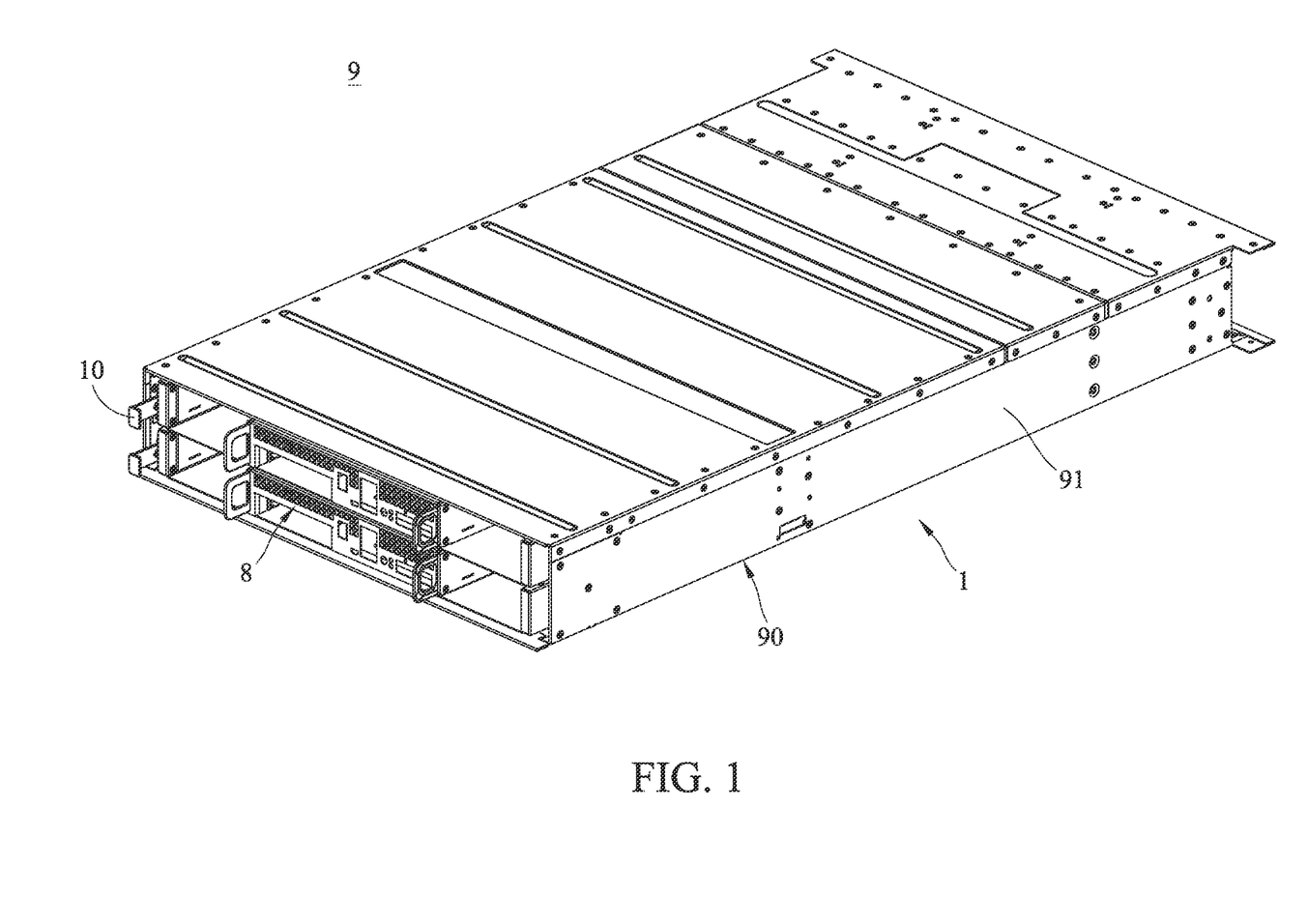
FIG. 1 is a perspective view of a casing assembly and an electronic device including the same according to one embodiment of the disclosure when detachable module is accommodated therein.
Figure 2:
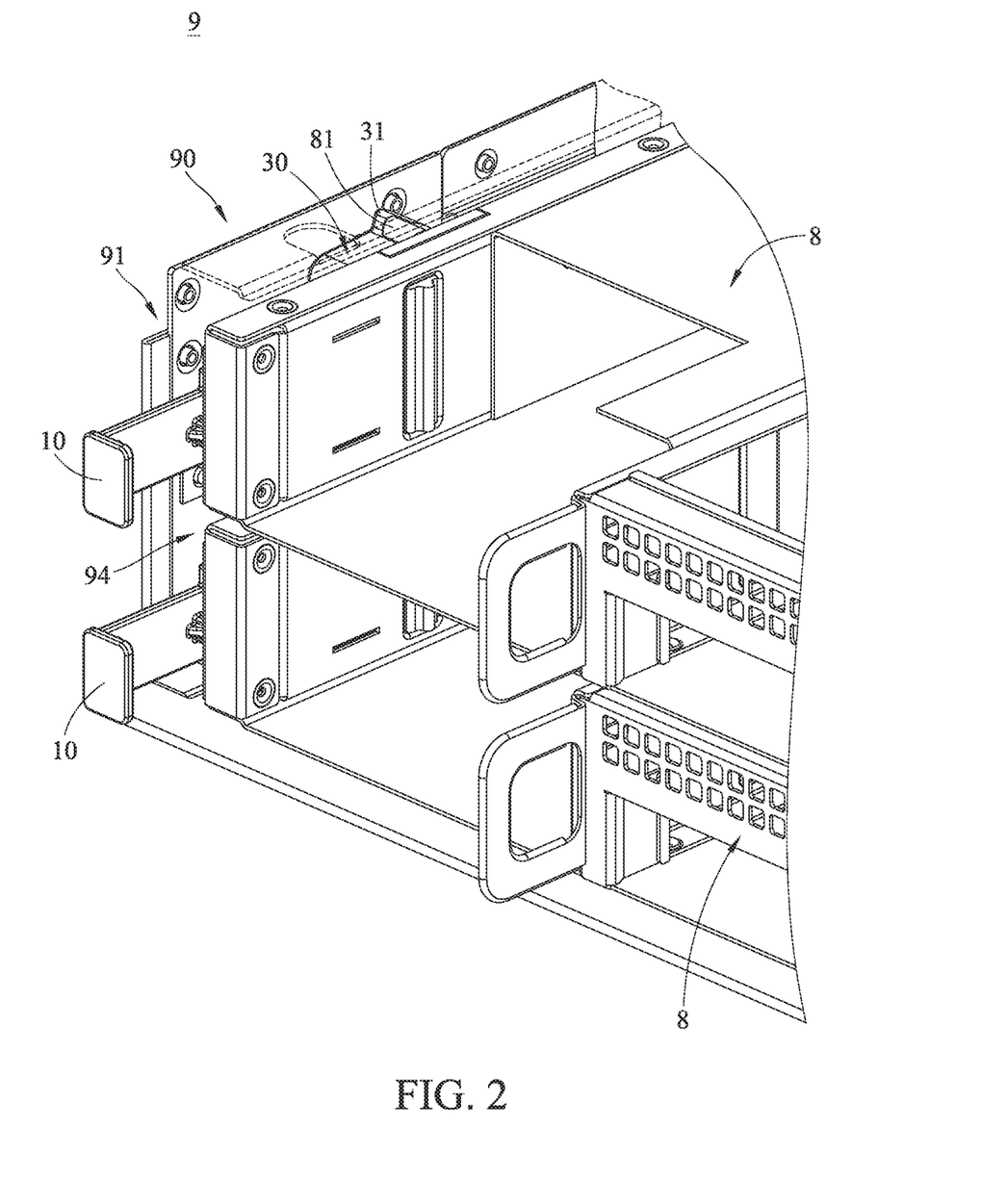
FIG. 2 is a partially enlarged view of FIG. 1.

Firstly, referring to FIGS. 1-2, one embodiment of the disclosure provides an electronic device 9 including a casing assembly 1 configured to accommodate at least one detachable module 8. The detachable module 8 may be a server but the drawings only depict its chassis for the purpose of simplicity. Note that the detachable module 8 and its design are exemplary but not limiting. In one example, the detachable module 8 may have one or more pluggable power supplies (not shown) thereon to receive external power for the detachable module 8.

In this embodiment, the casing assembly 1 may include a casing 90 configured to accommodate at least two detachable modules 8 and make the two detachable modules 8 arranged in a stack manner. Note that the number of the detachable modules 8 that the casing 90 of the casing assembly 1 can accommodate is exemplary but not limiting. In other embodiments, the casing assembly is able to accommodate more than two detachable modules. In another embodiment, the casing assembly is only able to accommodate one detachable module.

In this embodiment, the casing 90 may include two outer walls 91 respectively located at two opposite sides of the casing 90. When the detachable module 8 is accommodated within the casing 90, the outer walls 91 are respectively located at two opposite sides of the detachable module 8.

Figure 3:
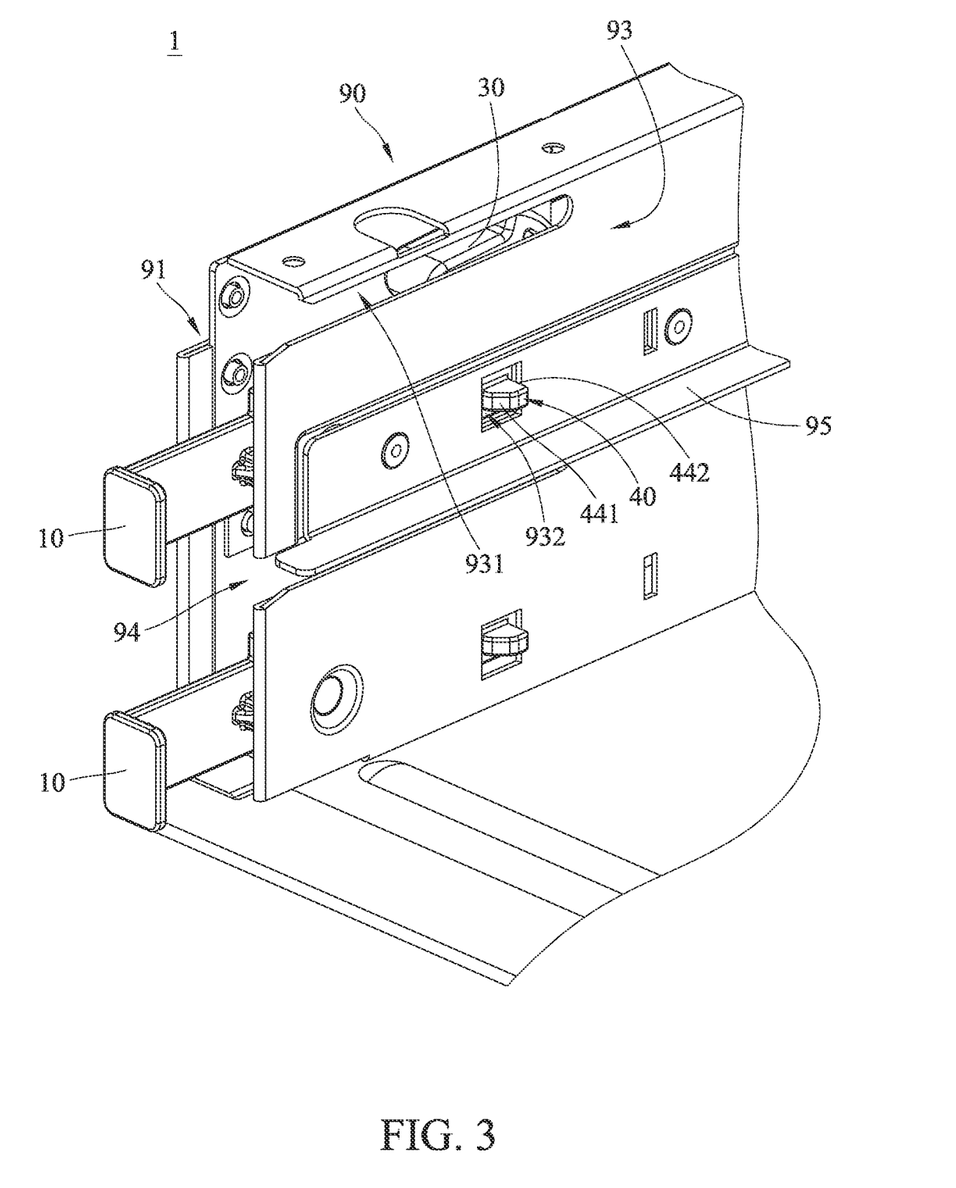
FIGS. 3-4 are partially enlarged view of a casing assembly in FIG. 1.
Figure 4:
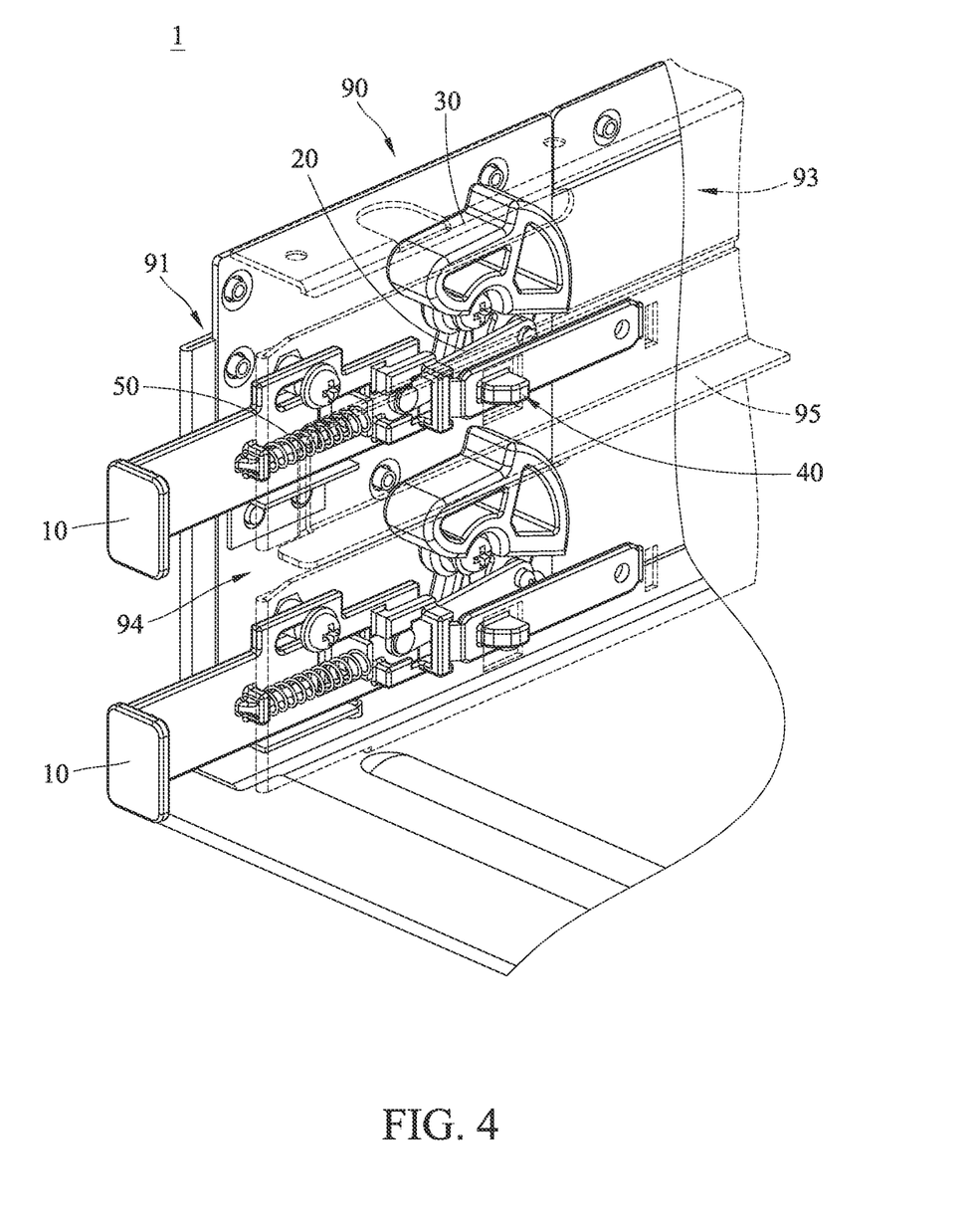

Except for accommodating the detachable module 8, the casing assembly 1 is also able to facilitate the removal of the detachable module 8 from the casing 90. Please refer to FIGS. 1-2 and further refer to FIGS. 3-4, the casing assembly 1 may further include at least one handle 10 and at least one trigger 30, the handle 10 and the trigger 30 are movably disposed on the outer wall 91 of the casing 90. In specific, the handle 10 and the trigger 30 may be arranged at the inner side or inner surface of the outer wall 91. In this embodiment, the outer walls 91 of the casing 90 each have two handles 10 and two triggers 30 thereon, each handle 10 may be directly or indirectly connected to one of the triggers 30 so that the handle 10 is able to cause the connected trigger 30 to push one of the detachable modules 8. As shown, there are two sets of handle 10 and trigger 30 on the outer wall 91 respectively for the detachable modules 8 being arranged in stack manner. For the purpose of simple illustration and simplicity, the drawings may only depict part of the outer wall 91 and only one set of handle 10 and trigger 30 and relevant components will be described in detail hereinafter.

Figure 5:
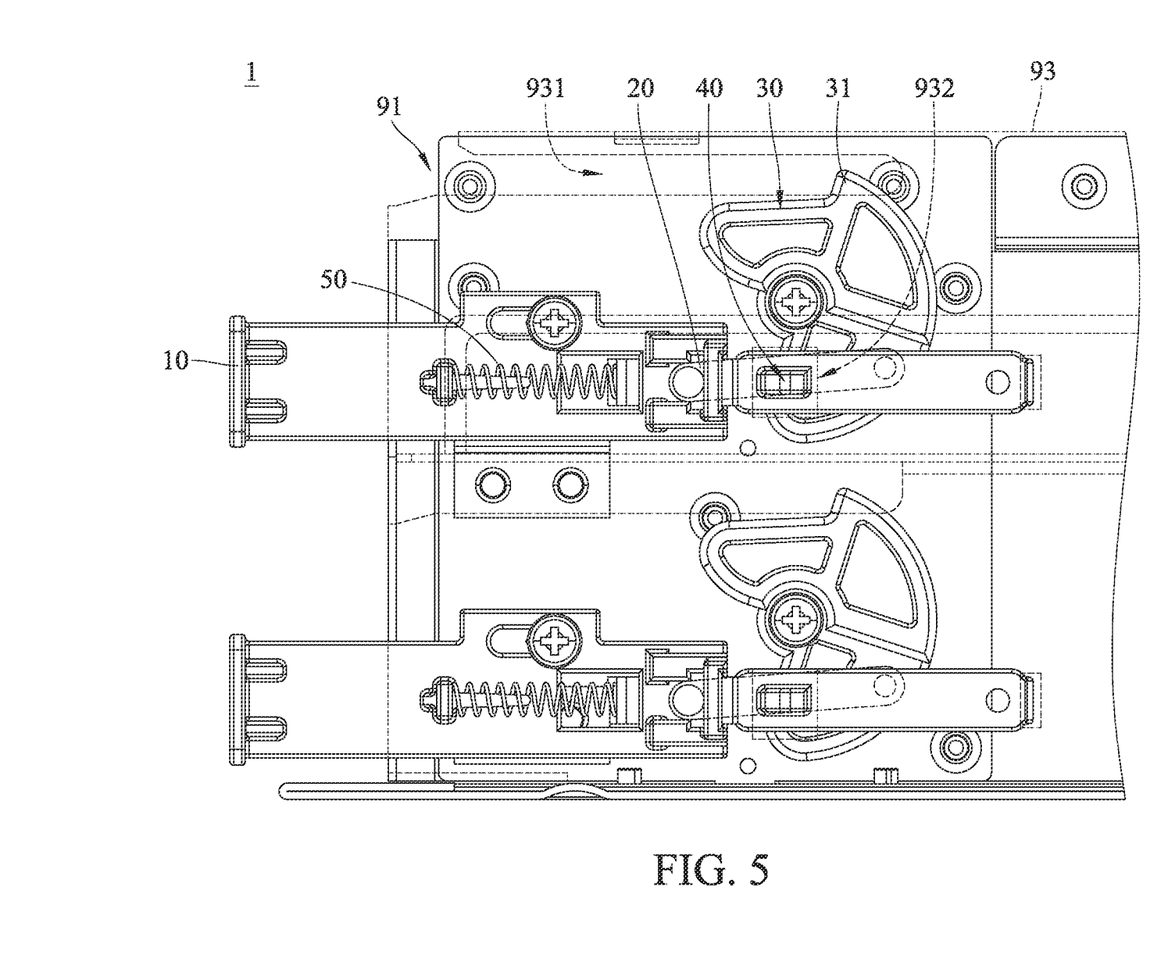
FIG. 5 is a side view of FIG. 4.
Figure 6:
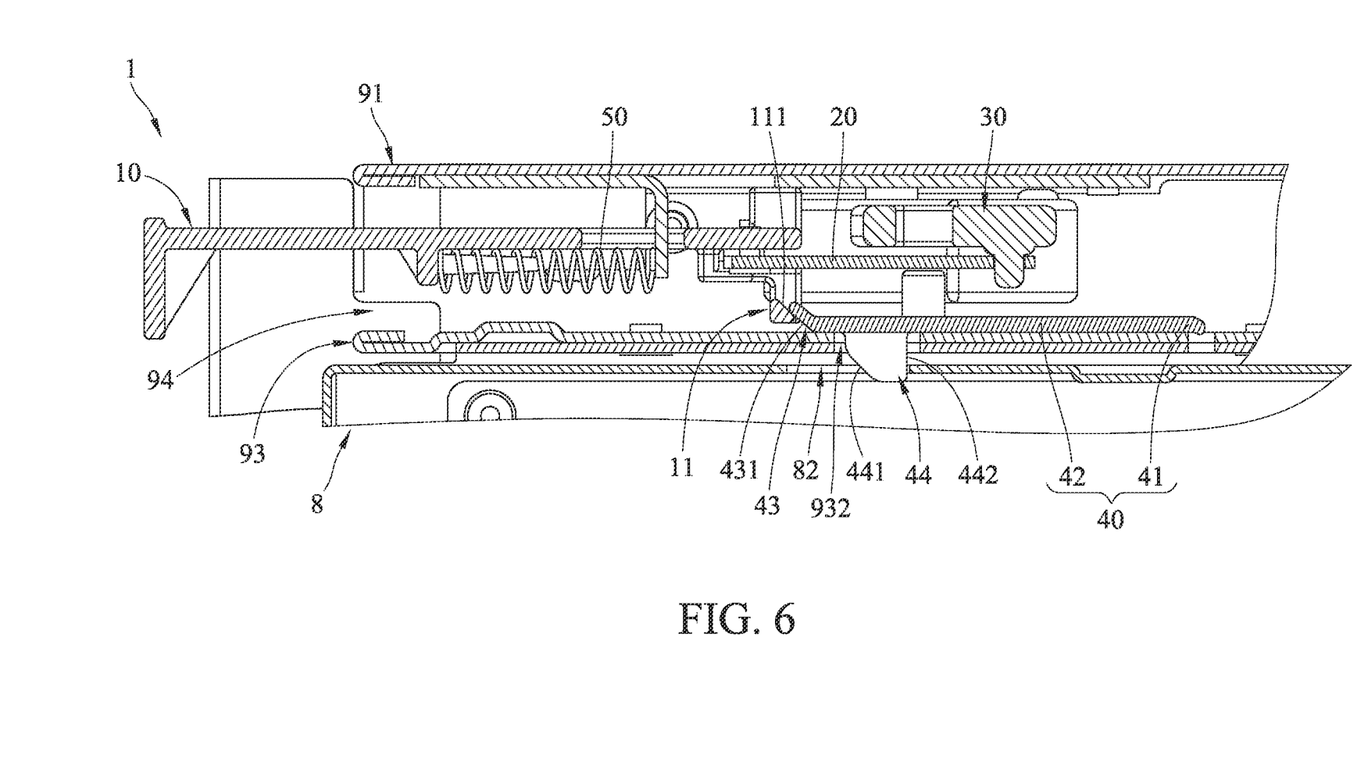
FIG. 6 is a partially enlarged view of FIG. 2.
Figure 7:
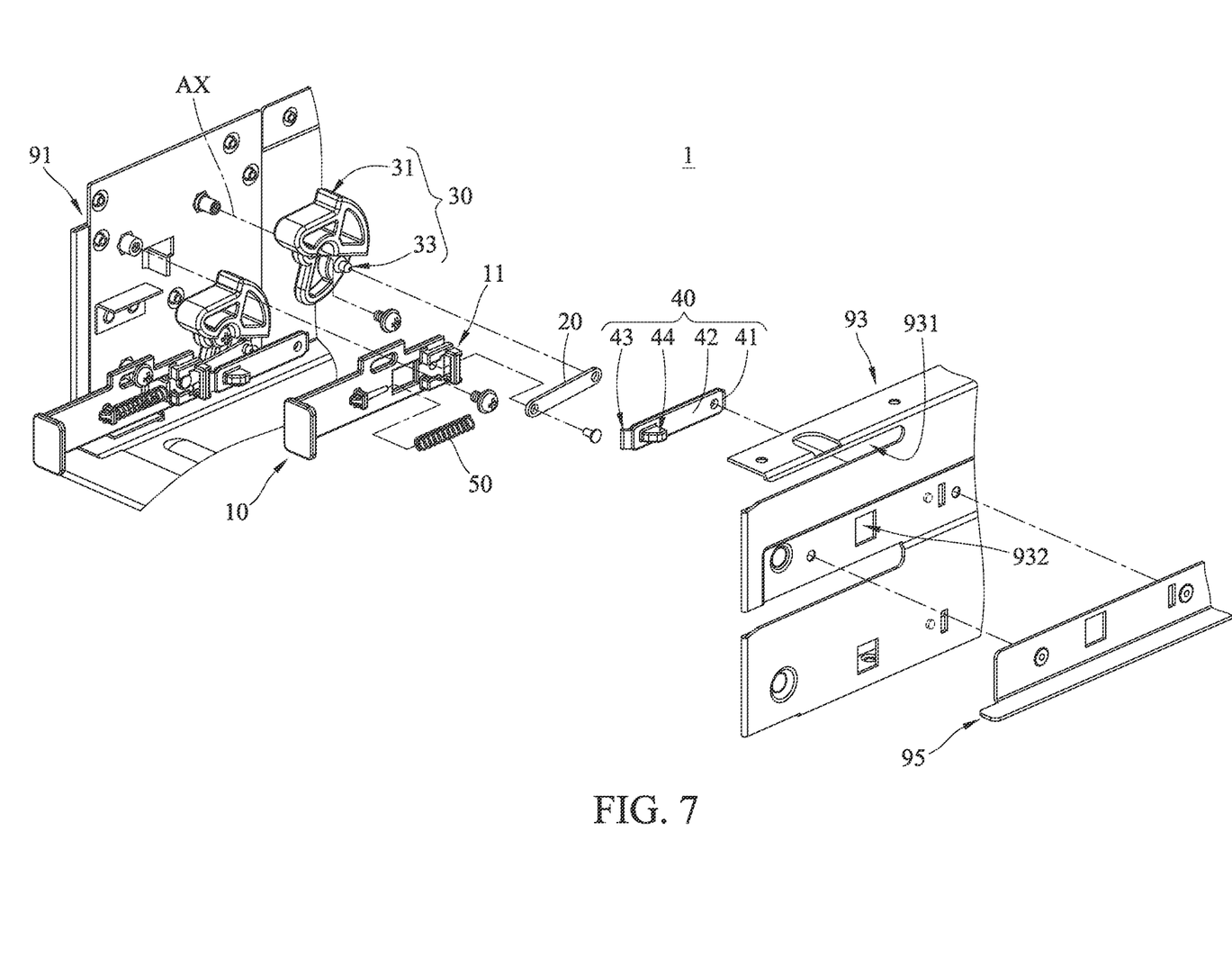
FIG. 7 is an exploded view of the casing assembly in FIG. 3.

Please further refer to FIGS. 5-7, in this embodiment, the handle 10 is movably disposed on the outer wall 91 of the casing 90, at least part of the handle 10 is located outside the casing 90 and therefore can be pushed by user. Herein, the handle 10 is movable relative to the casing 90 so as to have a releasing position (as shown in FIGS. 1-6) and a pushed position (as shown in FIGS. 8B-10). The releasing position means that the handle 10 is in a status when no external force is applied thereto. The pushed position means when the handle had moved a predetermined distance in a specific direction (e.g., pushing direction D1 in FIG. 8B) relative to the casing 90 when being forced by external force, such as push of human finger.

Optionally, the casing assembly 1 may include a restoring component 50. In one example, the restoring component 50 may be any suitable compression spring. The restoring component 50 may be connected between the handle 10 and the outer wall 91 and configured to force the handle 10 to move toward the releasing position, thus the restoring component 50 is able to restore the handle 10 back to the releasing position when there is no external force applied to the handle 10.

The trigger 30 is rotatably disposed on the outer wall 91 of the casing 90 and is rotatable about an axis AX. The trigger 30 is movable by the handle 10 and therefore has an original position (as shown in FIGS. 1-6) and a pushing position (as shown in FIGS. 8B-10). During the movement of the handle 10 from the releasing position to the pushed position, the handle 10 causes the trigger 30 to move toward the pushing position from the original position.

In this embodiment, the trigger 30 may include a triggering portion 31 and a pushed portion 33. The triggering portion 31 is configured to push the detachable module 8. For example, the triggering portion 31 of the trigger 30 is configured to push a protruding structure (e.g., a protrusion 81 in FIG. 2) on a side of the detachable module 8. The pushed portion 33 and the triggering portion 31 are respectively located at different sides of the trigger 30 and are both spaced apart from the axis AX. The pushed portion 33 means the portion of the trigger 30 that directly or indirectly receives the pushing force of the handle 10. As such, the handle 10 is able to cause the trigger 30 and its triggering portion 31 to rotate about the axis AX by pushing the pushed portion 33.

In this embodiment, the casing assembly 1 may include a link component 20, one end of the link component 20 may be pivotably connected to the handle 10, and another end of the link component 20 may be pivotably connected to the pushed portion 33 of the trigger 30. As such, the handle 10 is able to move the pushed portion 33 by pushing the link component 20, and thus the trigger 30 and its triggering portion 31 are rotated about the axis AX when the pushed portion 33 is moved by the link component 20.

The casing assembly 1 is able to prevent external force, vibration, or impact from causing the detachable module 8 to move relative to the casing 90. In specific, optionally, the casing assembly 1 may further include at least one engagement component 40, and the casing 90 may further include two inner walls 93, the inner walls 93 are respectively arranged at the inner sides of the outer walls 91 and are respectively spaced apart from the outer walls 91, such that the inner wall and the adjacent outer wall 91 together define an interval portion 94 therebetween. The aforementioned handle 10, the link component 20, the trigger 30, and the restoring component 50 may be accommodated in the interval portion 94 and arranged adjacent to the outer wall 91. The engagement component 40 is accommodated in the interval portion 94 and located adjacent to the inner wall 93. In detail, the engagement component 40 may be disposed at the surface of the inner wall 93 facing the adjacent outer wall 91; in other words, the aforementioned handle 10, the link component 20, the trigger 30, and the restoring component 50 and the engagement component 40 are respectively located at two opposite sides of the interval portion 94.

In such an arrangement, when the detachable module 8 is accommodated in the casing 90, the detachable module 8 is arranged between the two inner walls 93. Optionally, there may be a rail 95 arranged on the surface of the inner wall 93 located away from the outer wall 91, the rail 95 is able to support and guide one of the detachable modules 8 and therefore can keep the detachable modules 8 in a stack manner. Also, the inner wall 93 may have at least one groove 931, the protrusion 81 of the detachable module 8 may be slidably disposed through the groove 931 of the inner wall 93, thus the protrusion 81 and the rail 95 can together prevent the detachable module 8 from moving in directions other than the pushing direction D1 and the removal direction D1'. At least part of the triggering portion 31 is exposed by the groove 931; that is, the protrusion 81 of the detachable module 8 is located at the path of the triggering portion 31 of the trigger 30 and therefore can be moved by the triggering portion 31.

The engagement component 40 may be an elastic and integrally formed piece made of any suitable plastic or metal. In this embodiment, the engagement component 40 may include a fixed end 41, an elastic arm 42, a free end 43, and an engagement structure 44, the fixed end 41 and the free end 43 are respectively located at two opposite ends of the elastic arm 42, the engagement structure 44 protrudes from the elastic arm 42 and is located adjacent to the free end 43. The engagement component 40 is fixed to the inner wall 93 via the fixed end 41. The engagement structure 44 is removably disposed through one of at least one through hole 932 of the inner wall 93, thus the engagement structure 44 is removably disposed through or engaged with one of engaging hole 82 on the detachable module 8.

When the free end 43 is experiencing external force to cause the elastic arm 42 to deform, the engagement structure 44 on the elastic arm 42 is moved toward or away from the inner wall 93. For example, in this embodiment, the handle 10 may have a pushing portion 11 configured to push the free end 43 of the engagement component 40. The pushing portion 11 may be an inclined surface 111 at an angle to the pushing direction D1 of the handle 10. The free end 43 may have an inclined surface 431 which is at an angle to the pushing direction D1 of the handle 10. The pushing portion 11 of the handle 10 is configured to push the inclined surface 431. In such an arrangement, the movement of the handle 10 toward the pushed position can produce a pushing force to cause the free end 43 to move away from the inner wall 93 and therefore causes the elastic arm 42 to deform, causing the engagement structure 44 to disengage from the through hole 932 of the casing 90 and the engaging hole 82 of the detachable module 8.

The free end 43 is moved toward or away from the inner wall 93 when external force is directly applied to the elastic arm 42. In specific, the engagement structure 44 of the engagement component 40 may include a guiding surface 441 and a stopping surface 442 located opposite to each other, as shown, the stopping surface 442 vertically protrudes from the elastic arm 42, and the guiding surface 441 may be inclined relative to the stopping surface 442. When the engagement structure 44 is disposed through the engaging hole 82 of the detachable module 8, the stopping surface 442 stops the detachable module 8 from moving in the removal direction D1'. When the detachable module 8 is placed into the casing 90, the detachable module 8 pushes the guiding surface 441 so as to deform the elastic arm 42, such that the engagement structure 44 is moved away from the path of the detachable module 8.

Then, please refer to FIGS. 8A-10 to introduce the operation of taking out the detachable module 8 from the casing assembly 1. For the simplicity and simple illustration, only part of the detachable module 8 (e.g., the protrusion 81) and only one of the casing assemblies 1 will be shown in FIGS. 8A-10.

Figure 8A:
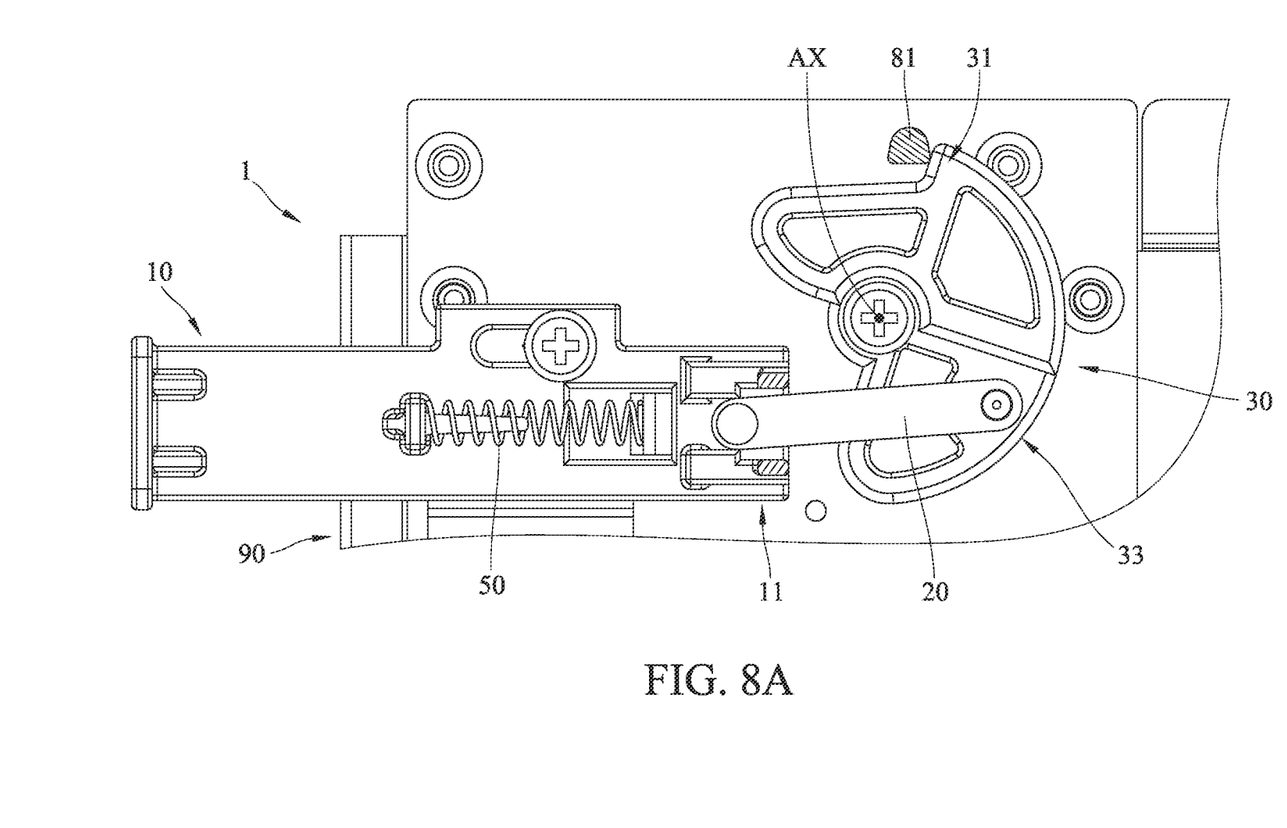

Firstly, in FIG. 8A, the detachable module 8 is installed in the casing assembly 1, and the handle 10 is keep in the releasing position by the restoring component 50. When the handle 10 is in the releasing position, the part of the handle 10 sticking out of the casing 90 is relatively longer, and the trigger 30 is not yet moved by the handle 10 and therefore stays in the original position. When the trigger 30 is in the original position, the triggering portion 31 may slightly contact or not yet contact the protrusion 81.

Figure 8B:
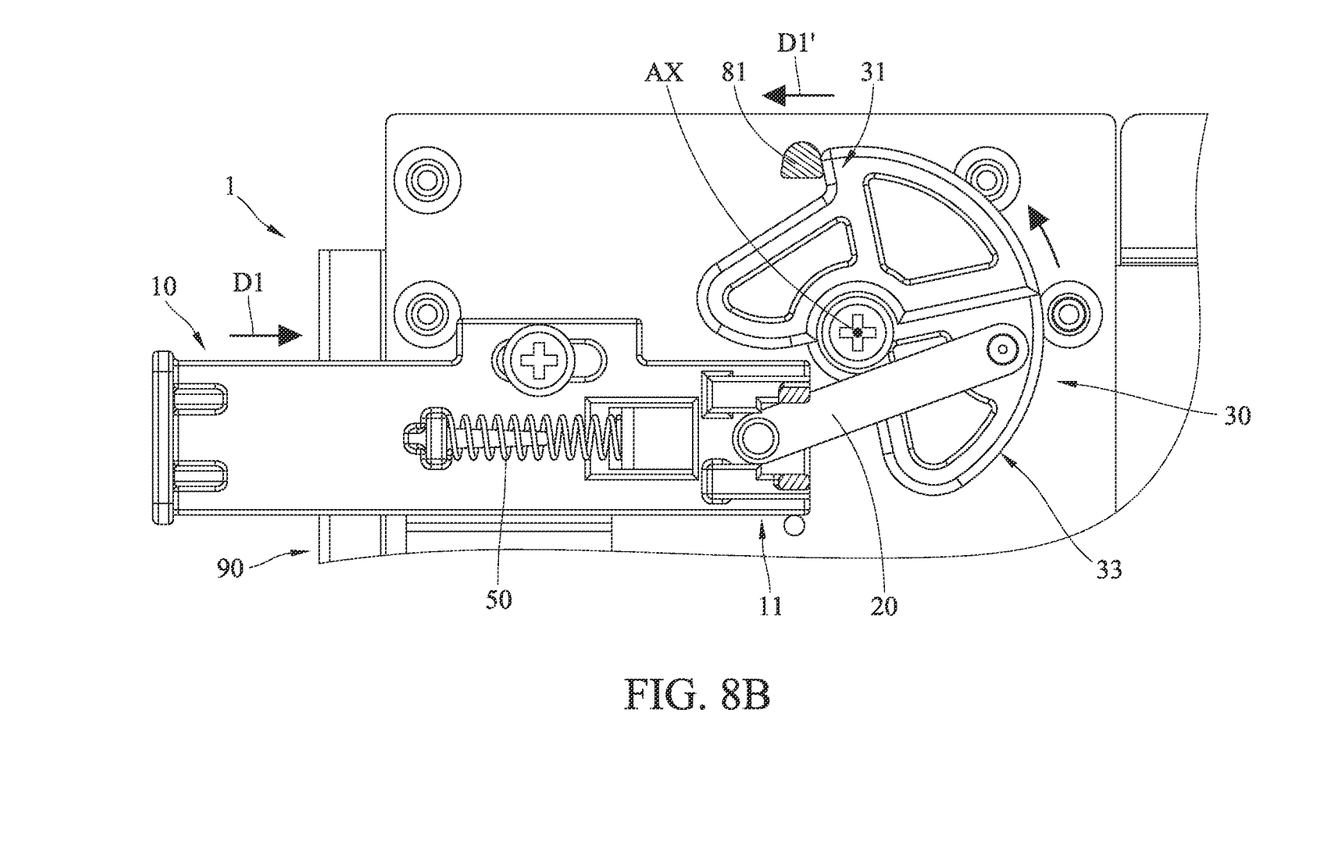

Then, in FIG. 8B, when the handle 10 is pushed toward the pushing position along the pushing direction D1, the handle 10 causes the pushed portion 33 of the trigger 30 to rotate about the axis AX via the link component 20 (as indicated by the arrows). The trigger 30 is rotated toward the pushing position from the original position so as to cause the triggering portion 31 of the trigger 30 to force the protrusion 81 to move in a removal direction D1' opposite to the pushing direction D1. By doing so, the detachable module 8 is partially moved out of the casing 90.

Figure 9:
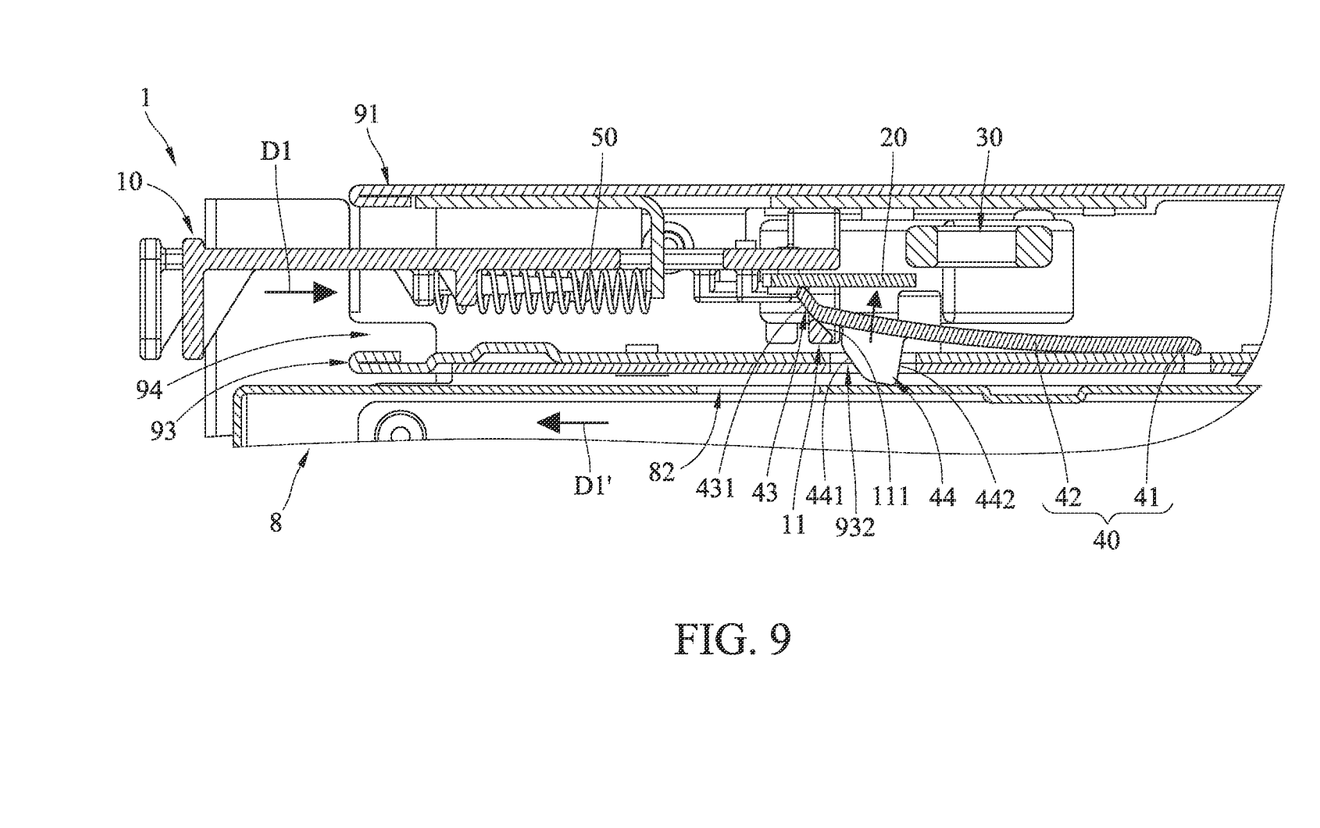

Meanwhile, in FIG. 9, while the handle 10 is moving along the pushing direction D1, the pushing portion 11 pushes the inclined surface 431 of the free end 43 of the engagement component 40 to move away from the inner wall 93, and the elastic arm 42 is deformed so as to cause the engagement structure 44 on the elastic arm 42 to disengage from the through hole 932 of the casing 90 and the engaging hole 82 of the detachable module 8 and move away from the path of the detachable module 8.

Figure 10:
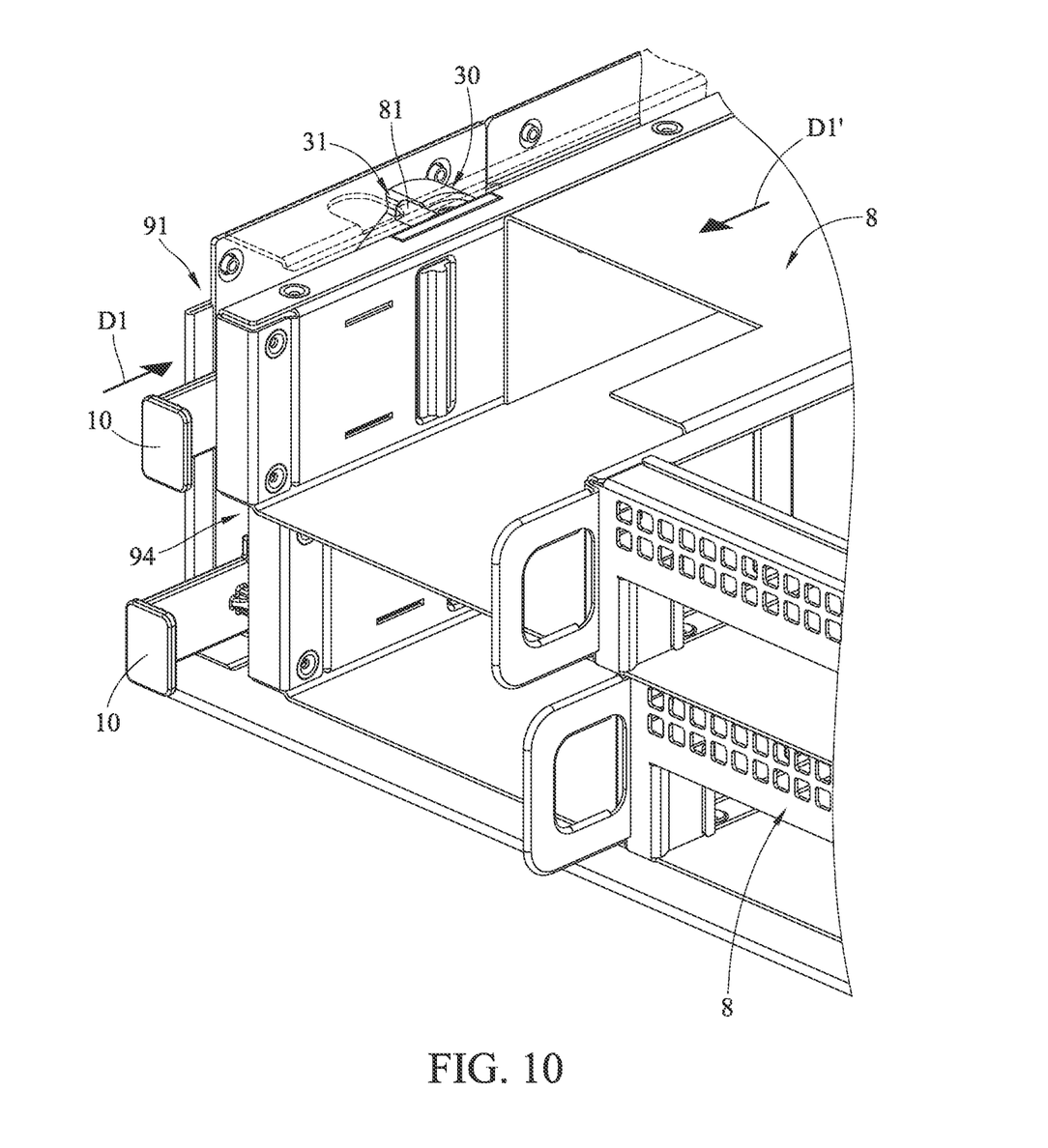
FIG. 10 depicts that one of the detachable modules is to be removed by being triggered by the casing assembly.

As discussed, simply pushing the handle 10 can cause the engagement component to disengage from the detachable module 8 and cause the trigger 30 to push the detachable module 8 out of the casing 90. As shown in FIG. 10, the detachable module 8 protrudes out of the casing 90 and thus facilitating the user to take the detachable module 80 out of the casing.

On the other hand, simply placing the detachable module 8 into the casing 90 can achieve the installation of the detachable module 8. In specific, the detachable module 8 can force the engagement structure 44 to move away from the through hole 932 of the casing 90, the engaging hole 82, and the path of the detachable module 8 by the engagement structure 44 pushing the guiding surface 441, thus the engagement structure 44 will not block the placement of the detachable module 8 into the casing 90. When the detachable module 8 is moved back to the position as shown in FIG. 6, the engagement component 40 returns to its original position so that the stopping surface 442 of the engagement structure 44 holds the detachable module 8 and prevents the detachable module 8 from moving in the removal direction D1'.

The engagement structure 44 of the engagement component 40 is able to effectively secure the position of the detachable module 8 and prevent external force, vibration, or impact from moving the detachable module 8 from the casing 90. Thus, in the cases that the detachable module 8 has at least one pluggable power supplies thereon, the engagement component 40 is able to secure and prevent the position of the detachable module 8 relative to the casing 90 from being affected by force related to pulling or plugging the pluggable power supplies.

Figure 11:
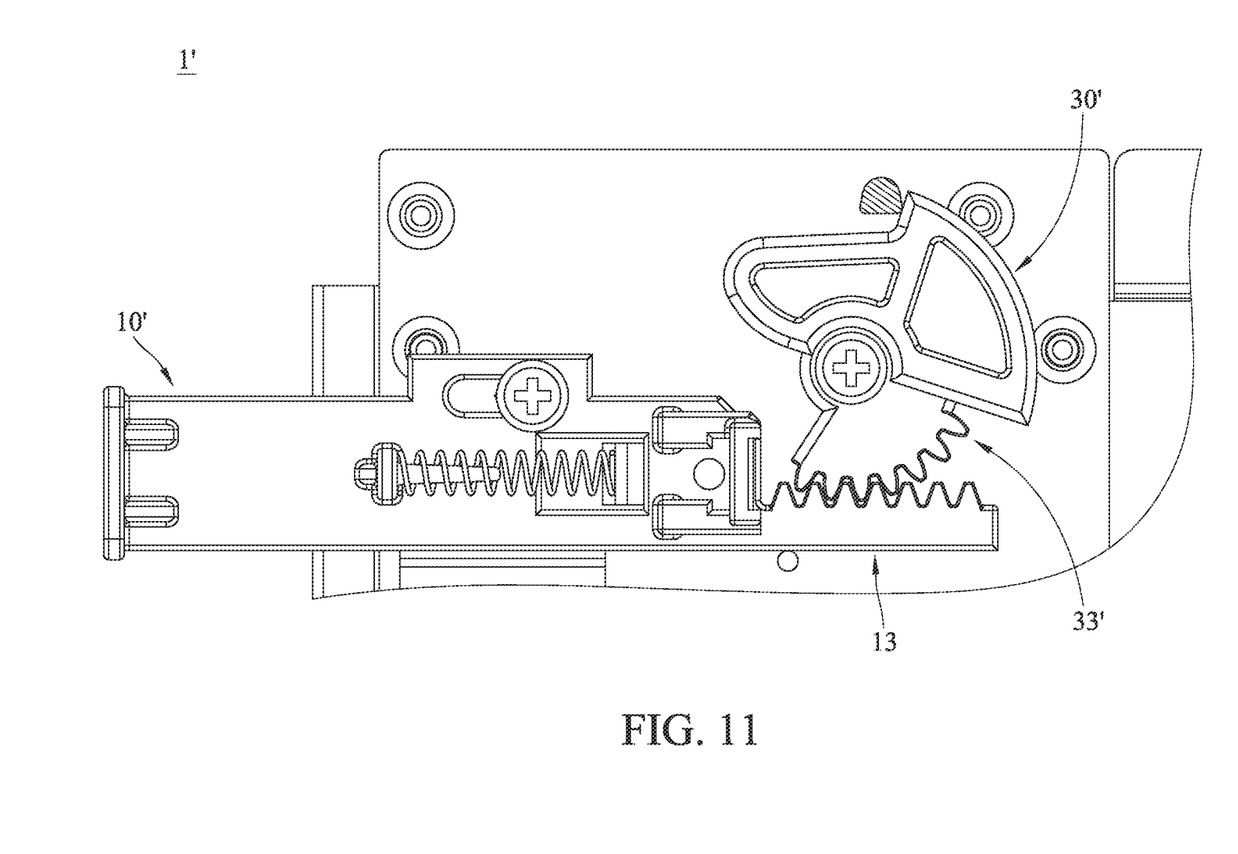
FIG. 11 is a partially enlarged side view of a casing assembly according to another embodiment of the disclosure.

Note that previous embodiment is exemplary but not limiting. Please refer to FIG. 11, another embodiment of the disclosure provides a casing assembly 1'. For the simplicity, only the main differences between the previous and following embodiments will be described in detail, and the similar or the same parts thereof can be comprehended with reference to the previous paragraphs and therefore is not repeated hereinafter. Also, the same reference number denote to the same component or element. In this embodiment, the casing assembly 1' omits the aforementioned link component and includes a handle 10' having a teeth portion 13, and a pushed portion 33' of a trigger 30' may include part of a gear, thus the teeth portion 13 is able to mesh with the pushed portion 33'. In this case, the handle 10' still can cause the trigger 30' to rotate to achieve the similar function done by the previous embodiment.

Figure 12:
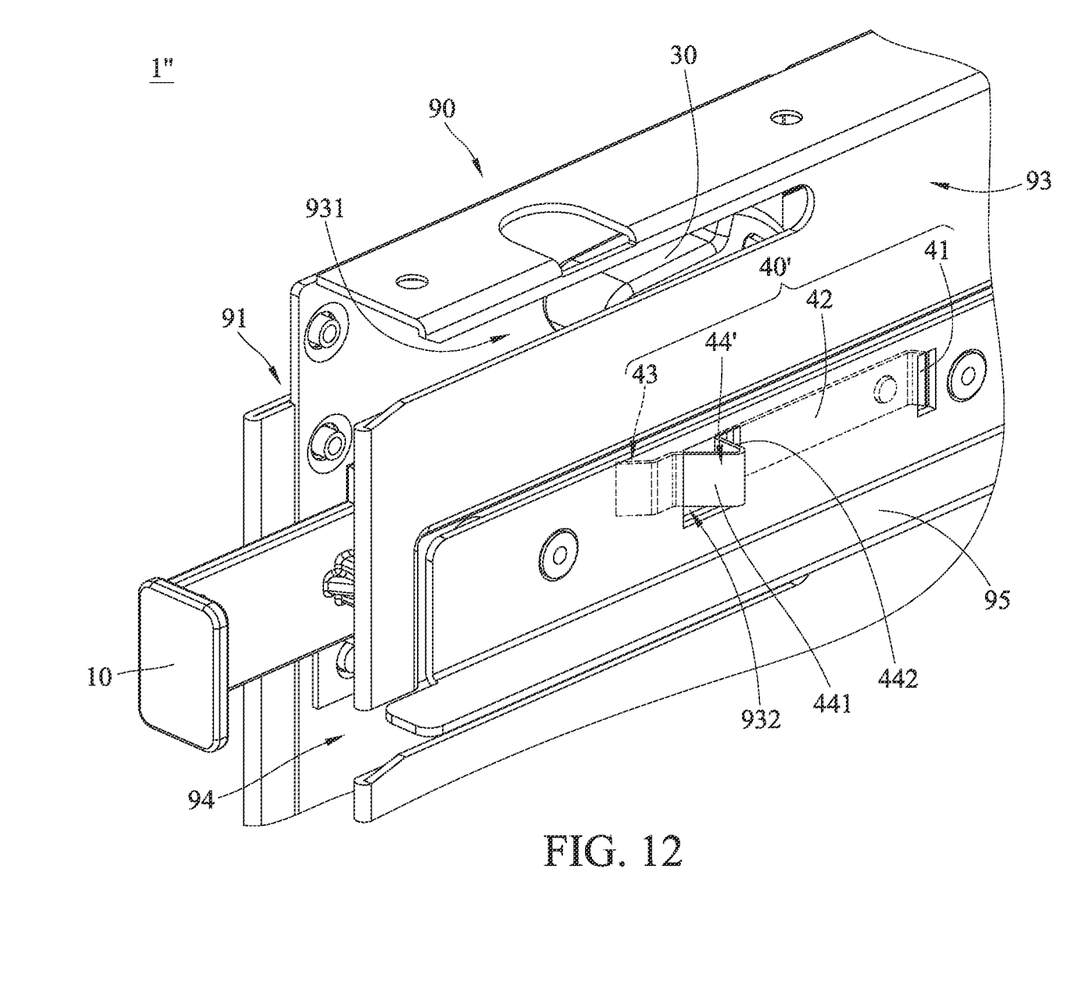
FIG. 12 is a partially enlarged perspective view of a casing assembly according to another embodiment of the disclosure.

Please refer to FIG. 12, another embodiment of the disclosure provides a casing assembly casing assembly 1". For the simplicity, only the main differences between the previous and following embodiments will be described in detail, and the similar or the same parts thereof can be comprehended with reference to the previous paragraphs and therefore is not repeated hereinafter. Also, the same reference number denote to the same component or element. In this embodiment, the casing assembly 1" includes an engagement component 40' being an integrally formed elastic sheet, as shown, the engagement component 40' has an engagement structure 44' being a convex shape.

According to the casing assembly and electronic device including the same as discussed in the above embodiments of the disclosure, the trigger is connected to the handle and able to move the detachable module, thus pushing the handle in a pushing direction can cause the trigger to move the detachable module in an opposite direction. This arrangement enables a toolless and easy removal of the detachable module simply by one push and thus helping to provide an effortlessly and efficient way to install and remove modules that are heavy or large in size.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A casing assembly, adapted for a detachable module, comprising:
a casing comprising an outer wall and an inner wall opposite to each other, wherein the inner wall and the outer wall together define an interval portion, and the detachable module is accommodated on one side of the inner wall opposite to the outer wall;
a handle movably disposed on the outer wall of the casing and accommodated in the interval portion;
a trigger rotatably disposed on the outer wall of the casing and accommodated in the interval portion, the trigger being connected to the handle, and the trigger comprising a triggering portion; and
an engagement component accommodated in the interval portion, the engagement component comprising a fixed end and a free end, the fixed end fixed to the inner wall, the free end in direct contact with the handle, and the free end being pushed by the handle to move away from the inner wall of the casing and move towards the outer wall of the casing;
wherein the detachable module is moved away from the casing by the handle through the triggering portion of the trigger.

2. The casing assembly according to claim 1, wherein the engagement component is removably disposed through a through hole of the inner wall, and the engagement component is removed from the through hole by being pushed by the handle selectively.

3. The casing assembly according to claim 2, wherein the engagement component further comprises an elastic arm, and an engagement structure, the free end and the fixed end are respectively located at two ends of the elastic arm, the engagement structure protrudes from the elastic arm and is located adjacent to the free end, and the engagement structure is removably disposed through the through hole of the inner wall.

4. The casing assembly according to claim 3, wherein the engagement structure comprises a guiding surface and a stopping surface located opposite to each other, the stopping surface vertically protrudes from the elastic arm, and the guiding surface is inclined relative to the stopping surface.

5. The casing assembly according to claim 3, wherein the engagement component is an integrally formed elastic sheet.

6. The casing assembly according to claim 3, wherein the handle comprises a pushing portion, and an inclined surface of the free end is pushed by the pushing portion selectively.

7. The casing assembly according to claim 1, further comprising a link component, the link component has an end pivotably connected to the handle and an another end pivotably connected to the trigger.

8. The casing assembly according to claim 1, wherein the handle comprises a teeth portion, the trigger comprises a pushed portion meshed with the teeth portion.

9. The casing assembly according to claim 1, further comprising a restoring component disposed between the casing and the handle, and the handle is moved back to a releasing position from a pushed position selectively by the restoring component.

10. An electronic device, adapted for a detachable module, comprising:
a casing comprising an outer wall and an inner wall opposite to each other, wherein the inner wall and the outer wall together define an interval portion, and the detachable module is accommodated on one side of the inner wall opposite to the outer wall;
a handle movably disposed on the outer wall of the casing and accommodated in the interval portion;
a trigger rotatably disposed on the outer wall of the casing and accommodated in the interval portion, the trigger being connected to the handle, and the trigger comprising a triggering portion; and
an engagement component accommodated in the interval portion, the engagement component comprising a fixed end and a free end, the fixed end fixed to the inner wall, the free end in direct contact with the handle, and the free end being pushed by the handle to move away from the inner wall of the casing and move towards the outer wall of the casing;
wherein when the handle is moved along a pushing direction to push the trigger, the detachable module is moved along a removal direction opposite to the pushing direction by being forced by the handle through the triggering portion of the trigger.

11. The electronic device according to claim 10, wherein the engagement component is removably disposed through a through hole of the inner wall, and the engagement component is removed from the through hole by being pushed by the handle selectively.

12. The electronic device according to claim 11, wherein the engagement component further comprises an elastic arm, and an engagement structure, the free end and the fixed end are respectively located at two ends of the elastic arm, the engagement component is fixed to the inner wall via the fixed end, the engagement structure protrudes from the elastic arm and is located adjacent to the free end, the engagement structure is removably disposed through the through hole of the inner wall.

13. The electronic device according to claim 12, wherein the engagement structure comprises a guiding surface and a stopping surface located opposite to each other, the stopping surface vertically protrudes from the elastic arm, and the guiding surface is inclined relative to the stopping surface.

14. The electronic device according to claim 12, wherein the engagement component is an integrally formed elastic sheet.

15. The electronic device according to claim 12, wherein the handle comprises a pushing portion, an inclined surface of the free end is pushed by the pushing portion selectively, and the pushing portion and the inclined surface are both inclined relative to the pushing direction of the handle.

16. The electronic device according to claim 10, further comprising a link component, the link component has an end pivotably connected to the handle and an another end pivotably connected to the trigger.

17. The electronic device according to claim 10, wherein the handle comprises a teeth portion, the trigger comprises a pushed portion meshed with the teeth portion.

18. The electronic device according to claim 10, further comprising a restoring component disposed between the casing and the handle, and the handle is moved back to a releasing position from a pushed position along a direction opposite to the pushing direction selectively by the restoring component.

19. The electronic device according to claim 11, wherein there is a rail disposed on a side of the inner wall located away from the outer wall, and the rail is configured to support the detachable module.

20. The electronic device according to claim 11, wherein the inner wall has a groove and the detachable module has a protrusion, the protrusion of the detachable module is slidably disposed through the groove, part of the triggering portion is exposed by the groove, and the protrusion of the detachable module is pushed by the triggering portion selectively.

* * * * *